(12) United States Patent
Koizumi et al.

(10) Patent No.: US 10,008,622 B2
(45) Date of Patent: Jun. 26, 2018

(54) SOLAR CELL, METHOD FOR MANUFACTURING SAME, SOLAR CELL MODULE AND WIRING SHEET

(71) Applicant: KANEKA CORPORATION, Osaka-shi, Osaka (JP)

(72) Inventors: Gensuke Koizumi, Settsu (JP); Daisuke Adachi, Settsu (JP); Kunihiro Nakano, Settsu (JP)

(73) Assignee: KANEKA CORPORATION, Osaka-Shi, Osaka (JP)

( * ) Notice: Subject to any disclaimer, the term of this patent is extended or adjusted under 35 U.S.C. 154(b) by 0 days. days.

(21) Appl. No.: 15/561,876

(22) PCT Filed: Mar. 10, 2016

(86) PCT No.: PCT/JP2016/057626
§ 371 (c)(1),
(2) Date: Sep. 26, 2017

(87) PCT Pub. No.: WO2016/158299
PCT Pub. Date: Oct. 6, 2016

(65) Prior Publication Data
US 2018/0114873 A1 Apr. 26, 2018

(30) Foreign Application Priority Data

Mar. 31, 2015 (JP) .................. 2015-074529
Mar. 31, 2015 (JP) .................. 2015-074531

(51) Int. Cl.
*H01L 31/00* (2006.01)
*H01L 31/05* (2014.01)
(Continued)

(52) U.S. Cl.
CPC .... *H01L 31/0504* (2013.01); *H01L 31/02167* (2013.01); *H01L 31/022425* (2013.01);
(Continued)

(58) Field of Classification Search
CPC ......... H01L 31/022425; H01L 31/1884; H01L 31/022441; H01L 31/02167; H01L 31/022433
See application file for complete search history.

(56) References Cited

U.S. PATENT DOCUMENTS

2015/0075601 A1* 3/2015 Adachi ........... H01L 31/022425
136/256
2017/0084772 A1* 3/2017 Uto ..................... H01L 31/0747

FOREIGN PATENT DOCUMENTS

JP        S54-63689 A    5/1979
JP        H6-13634 A     1/1994
(Continued)

OTHER PUBLICATIONS

International Search Report dated May 31, 2016 for PCT/JP2016/057626, citing the above reference(s).
(Continued)

*Primary Examiner* — Ngan Ngo
(74) *Attorney, Agent, or Firm* — Hauptman Ham, LLP

(57) ABSTRACT

The solar cell includes: a first metal seed layer and a first plating layer provided on a first surface of a photoelectric conversion section; a second metal seed layer provided on a second surface of the photoelectric conversion section; and a third metal seed layer and a third plating layer provided on the lateral surface and the peripheral edge of the second surface of the photoelectric conversion section. The first metal seed layer is in electrical continuity with the third metal seed layer, while the second metal seed layer is in electrical non-continuity with the third metal seed layer. By supplying electricity to at least one of the first metal seed layer and the third metal seed layer, the first plating layer and the third plating layer are formed simultaneously.

20 Claims, 10 Drawing Sheets

(51) Int. Cl.
*H01L 31/0747* (2012.01)
*H01L 31/0216* (2014.01)
*H01L 31/18* (2006.01)
*H01L 31/0224* (2006.01)

(52) U.S. Cl.
CPC ............... *H01L 31/022441* (2013.01); *H01L 31/022475* (2013.01); *H01L 31/0747* (2013.01); *H01L 31/1884* (2013.01); *H01L 31/022433* (2013.01)

(56) References Cited

FOREIGN PATENT DOCUMENTS

| | | |
|---|---|---|
| JP | H6-163952 A | 6/1994 |
| JP | H8-78704 A | 3/1996 |
| JP | 2001-135834 A | 5/2001 |
| JP | 2011-35033 A | 2/2011 |
| JP | 2014-116451 A | 6/2014 |
| JP | 2014-179406 A | 9/2014 |
| WO | 2011/142666 A1 | 11/2011 |

OTHER PUBLICATIONS

International Preliminary Report on Patentability with Written Opinion of the International Searching Authority dated Oct. 12, 2017 corresponding to International Application No. PCT/JP2016/057626.

\* cited by examiner

SOLAR CELL, METHOD FOR MANUFACTURING SAME, SOLAR CELL MODULE AND WIRING SHEET

CROSS REFERENCE TO RELATED APPLICATION

This application claims the priority of Japanese Patent Application No. 2015-074529, filed on Mar. 31, 2015, and Japanese Patent Application No. 2015-074531, filed on Mar. 31, 2015, in the Japanese Patent and Trademark Office. Further, this application is the National Phase application of International Application No. PCT/JP2016/057626 filed on Mar. 10, 2016, which is incorporated herein by reference in its entirety.

TECHNICAL FIELD

The present invention relates to a solar cell, method for manufacturing the same, and a solar cell module. The present invention also relates to a wiring sheet used for formation of the solar cell module.

BACKGROUND ART

In a solar cell, carriers (electrons and holes) generated by photo irradiation to a photoelectric conversion section composed of a semiconductor junction or the like are extracted to an external circuit to generate electricity. In a heterojunction solar cell provided with a silicon-based thin-film and transparent electrode on a single-crystalline silicon substrate, providing a collecting electrode (metal electrode as an auxiliary electrode) is provided on a surface of the transparent electrode layer to improve current extraction efficiency.

A general solar cell is a double-sided electrode type solar cell including a collecting electrode for one conductivity-type (e.g., p-type) on a light-receiving surface, and a back electrode for opposite conductivity-type (e.g., n-type) on a back surface. The collecting electrode on the light-receiving side of the double-sided electrode type solar cell generally includes a plurality of finger electrodes for collecting photocarriers generated by light incidence, and a relatively thick bus bar electrode for extracting photocarriers collected in the finger electrodes to outside.

A plurality of solar cells are electrically connected to modularize the solar cells. In modularization of double-sided electrode type solar cells, the bus bar electrode provided on the light-receiving side is connected to the back electrode of the adjacent solar cell through an interconnector such as a tab line to establish series connection.

Further enhancement of efficiency of a solar cell module is expected, and reduction of an optical loss, improvement of module reliability, and so on are required. A region where collecting electrodes such as finger electrodes and a bus bar electrode are formed on the light-receiving side of a solar cell does not contribute to power generation because light is not incident to a photoelectric conversion section due to shading. Thus, it is required to reduce a shading loss caused by these electrodes, particularly a bus bar electrode.

A so-called back electrode type solar cell has been developed for reducing a shading loss caused by an electrode provided on a light-receiving surface. In the back electrode type solar cell, both a p-type electrode and an n-type electrode are formed on a back surface. Patent Document 1 suggests modularization of back electrode type solar cells using a wiring sheet. However, production of a back electrode type solar cell is more difficult and requires higher costs as compared to a double-sided electrode type solar cell.

Patent Document 2 discloses a solar cell in which bus bar electrode (main grid electrode) is not formed and only finger electrodes (sub-grid electrodes) are formed on a light-receiving surface, and in which a connection electrode such as a metal wire is formed on areas other than the light-receiving surface (e.g., on the lateral surfaces and a back surface). By connecting finger electrodes to the connection electrodes, the shading area on the light-receiving side can be reduced. As a technique similar to that in Patent Document 2, Patent Documents 3 and 4 each suggest forming an end surface electrode using a paste at one end of each of the solar cells and connecting mutually adjacent solar cells each other on the back side of each of the adjacent solar cells. In the solar cells in Patent Documents 2 to 4, photocarriers collected in finger electrodes on the light-receiving side are extracted to outside through the connection electrode and the end surface electrode. Accordingly, it is not necessary to provide a bus bar electrode having a large shading area on the light-receiving surface, and thus a shading loss caused by a collecting electrode on the light-receiving side can be reduced.

PRIOR ART DOCUMENTS

Patent Documents

Patent Document 1: Japanese Patent Laid-open Publication No. 2014-179406
Patent Document 2: Japanese Patent Laid-open Publication No. 2014-116451
Patent Document 3: Japanese Patent Laid-open Publication No. 6-13634
Patent Document 4: Japanese Patent Laid-open Publication No. 8-78704

SUMMARY OF THE INVENTION

Problems to be Solved by the Invention

Patent Document 2 suggests that electrodes on the light-receiving side and the back side are formed, and a collecting electrode and a wiring sheet are then connected to each other using a metal wire serving as a connection electrode. Patent Documents 3 and 4 suggest that electrodes on the light-receiving side and the back side are formed, and an end surface electrode is then formed by applying a silver paste to an end surface. For manufacturing the solar cells in Patent Documents 2 to 4, an additional step of forming a connection electrode and an end surface electrode is required, and therefore production efficiency is reduced as compared to a usual solar cell.

The present invention has been made in view of the above-described situations, and an object of the present invention is to provide a solar cell capable of simplifying formation of a connection electrode, and a solar cell module obtained using the solar cell. The present invention also provides a wiring sheet to be used for modularization of these solar cells.

Means for Solving the Problems

A solar cell of the present invention includes a photoelectric conversion section. The photoelectric conversion section includes a first conductivity-type silicon-based thin-film and a first transparent electrode layer in this order on a first principal surface of a conductive single-crystalline silicon substrate, and includes a second conductivity-type silicon-based thin-film and a second transparent electrode layer in this order on a second principal surface of the conductive single-crystalline silicon substrate.

The solar cell of the present invention includes a patterned collecting electrode for first conductivity-type on the first principal surface of the photoelectric conversion section, a back electrode for second conductivity-type on the second principal surface of the photoelectric conversion section, and a connection electrode which is in electrical continuity with the collecting electrode and which is in electrical non-continuity with the back electrode. The collecting electrode includes a first metal seed layer provided on the first principal surface of the photoelectric conversion section, and a first plating layer provided on the first metal seed layer. The back electrode includes a second metal seed layer provided on the second principal surface of the photoelectric conversion section. The connection electrode includes a third metal seed layer provided on the peripheral edge of the second principal surface of the photoelectric conversion section and the lateral surfaces of the photoelectric conversion section, and a third plating layer provided on the third metal seed layer. The third metal seed layer is in electrical continuity with the first metal seed layer, and is in electrical non-continuity with the second metal seed layer. The back electrode may further include a second plating layer provided on the second metal seed layer. Preferably, the second metal seed layer and the third metal seed layer are composed of the same material, and the first plating layer and the third plating layer are mainly composed of the same material.

A manufacturing method of the present invention includes the steps of forming a first metal seed layer on a first principal surface of a photoelectric conversion section; forming a second metal seed layer on a second principal surface of the photoelectric conversion section; and forming a third metal seed layer on the peripheral edge of the second principal surface of the photoelectric conversion section and the lateral surface of the photoelectric conversion section.

The first metal seed layer and the third metal seed layer are formed in electrical continuity with each other. The first metal seed layer and the third metal seed layer may be formed in contact with each other, or the first metal seed layer and the third metal seed layer may be electrically connected to each other through the first transparent electrode layer by forming the first transparent electrode layer and the third metal seed layer in contact with each other.

The second metal seed layer and the third metal seed layer are formed in such a manner that they are in electrical non-continuity with each other. In other words, the second metal seed layer and the third metal seed layer are insulated from each other. By depositing a metal layer from the second principal surface side of the photoelectric conversion section with a mask provided on the second principal surface of the photoelectric conversion section, the second metal seed layer and the third metal seed layer can be formed simultaneously and in such a manner that they are in electrical non-continuity with each other. In this way, the second metal seed layer and the third metal seed layer which are mainly composed of the same material are formed. Preferably, the first metal seed layer is formed using a paste containing a resin.

The manufacturing method of the present invention further includes the steps of forming a first plating layer on the first metal seed by a plating method; and forming a third plating layer on the third metal seed layer by a plating method. The first plating layer and the third plating layer are formed simultaneously by supplying electricity to at least one of the first metal seed layer and the third metal seed layer. Preferably, the first plating layer and the third plating layer are formed simultaneously by supplying electricity to the third metal seed layer. In this way, the first plating layer and the third plating layer which are mainly composed of the same material are formed. The manufacturing method of the present invention may include the step of forming a second plating layer on the second metal seed layer by a plating method.

In one embodiment, the photoelectric conversion section further includes a third transparent electrode layer. The third transparent electrode layer is provided on the peripheral edge of the second conductivity-type silicon-based thin-film and the lateral surface of the conductive single-crystalline silicon substrate, and is in electrical non-continuity with the second transparent electrode layer. The third metal seed layer is provided on the third transparent electrode layer. In this embodiment, the first metal seed layer and the third transparent electrode layer may be formed in contact with each other, or the first transparent electrode layer and the third transparent electrode layer may be formed in contact with each other.

The present invention relates to a solar cell module in which the solar cell is connected to other solar cell or an external circuit through a wiring sheet. The present invention also relates to a wiring sheet to be used for modularization of solar cells each having a connection electrode provided on the lateral surface.

One embodiment of the solar cell module of the present invention includes a first solar cell and a second solar cell which are electrically connected in series; and a wiring sheet. The first solar cell includes a collecting electrode provided on a light-receiving surface, a back electrode provided on a back surface, and a connection electrode. The second solar cell includes a collecting electrode provided on a light-receiving surface, and a back electrode provided on a back surface. The collecting electrode of the first solar cell and the collecting electrode of the second solar cell are formed in a pattern shape. The connection electrode of the first solar cell is in electrical continuity with the collecting electrode, and is in electrical non-continuity with the back electrode.

The collecting electrode of the first solar cell and the collecting electrode of the second solar cell are each an electrode for first conductivity-type, and the back electrode of the first solar cell and the back electrode of the second solar cell are each an electrode for second conductivity-type. The first solar cell and the second solar cell are each disposed in such a manner that the back electrode faces the first principal surface of the wiring sheet.

The wiring sheet of the present invention includes an insulating base, a first back-surface wiring line, a first electrical continuity section, and a second electrical continuity section. The insulating base is provided with a first through-hole and a second through-hole. The first back-surface wiring line is provided on a second principal surface of the insulating base. The first electrical continuity section is provided in the first through-hole, and the second electrical continuity section is provided in the second through-hole. The first back-surface wiring line electrically connects the first electrical continuity section and the second electrical continuity section to each other.

In the solar cell module of the present invention, the first electrical continuity section is electrically connected to the connection electrode of the first solar cell, and the second electrical continuity section is electrically connected to the back electrode of the second solar cell. Accordingly, the collecting electrode of the first solar cell and the back electrode of the second solar cell are electrically connected to each other through the connection electrode of the first solar cell, the first electrical continuity section, the first back-surface wiring line and the second electrical continuity section.

Preferably, the wiring sheet includes a first front-surface wiring line and a second front-surface wiring line on the first principal surface of the insulating base. The first front-surface wiring line is electrically connected to the first back-surface wiring line through the first electrical continuity section, and the second front-surface wiring line is electrically connected to the first back-surface wiring line through the second electrical continuity section. In this embodiment, the connection electrode of the first solar cell is connected to the first front-surface wiring line, and the back electrode of the second solar cell is connected to the second front-surface wiring line. Accordingly, the collecting electrode of the first solar cell and the back electrode of the second solar cell are electrically connected to each other.

The solar cell module according to one embodiment further includes a third solar cell electrically connected to the first solar cell in series. Like the first solar cell, the third solar cell includes a collecting electrode for first conductivity-type, a back electrode for second conductivity-type, and a connection electrode. The third solar cell is disposed in such a manner that the back electrode faces the first principal surface of the wiring sheet. The insulating base is further provided with a third through-hole and a fourth through-hole. The wiring sheet further includes a second back-surface wiring line provided on the second principal surface of the insulating base, a third electrical continuity section provided in the third through-hole, and a fourth electrical continuity section provided in the fourth through-hole. The second back-surface wiring line electrically connects the third electrical continuity section and the fourth electrical continuity section to each other.

In the embodiment described above, the third electrical continuity section is electrically connected to the back electrode of the first solar cell, and the fourth electrical continuity section is electrically connected to the connection electrode of the third solar cell. Accordingly, the back electrode of the first solar cell and the collecting electrode of the third solar cell are electrically connected to each other through the third electrical continuity section, the second back-surface wiring line, the fourth electrical continuity section, and the connection electrode of the third solar cell.

In the embodiment described above, it is preferable that the wiring sheet includes a first front-surface wiring line, a second front-surface wiring line, a third front-surface wiring line and a fourth front-surface wiring line on the first principal surface of the insulating base. The first front-surface wiring line is electrically connected to the first back-surface wiring line through the first electrical continuity section, the second front-surface wiring line is electrically connected to the first back-surface wiring line through the second electrical continuity section, the third front-surface wiring line is electrically connected to the second back-surface wiring line through the third electrical continuity section, and the fourth front-surface wiring line is electrically connected to the second back-surface wiring line through the fourth electrical continuity section. In this embodiment, the connection electrode of the first solar cell is connected to the first front-surface wiring line, and the back electrode of the second solar cell is connected to the second front-surface wiring line. Accordingly, the collecting electrode of the first solar cell and the back electrode of the second solar cell are electrically connected to each other. The back electrode of the first solar cell is connected to the third front-surface wiring line, and the connection electrode of the third solar cell is connected to the fourth front-surface wiring line. Accordingly, the back electrode of the first solar cell and the collecting electrode of the third solar cell are electrically connected to each other.

Preferably, the first front-surface wiring line is provided on the periphery of the third front-surface wiring line such that a spacing is provided between the first front-surface wiring line and the third front-surface wiring line. In one embodiment, the connection electrode of the first solar cell is provided on the peripheral edge of the back surface of the first solar cell and the lateral surface of the first solar cell, and the connection electrode provided on the peripheral edge on the back side is in contact with the wiring sheet.

Effects of the Invention

A connection electrode is provided, and thus necessity to provide a bus bar electrode having a large shading area on the light-receiving surface is eliminated, so that a shading loss caused by a collecting electrode can be reduced. In a solar cell of the present invention, the connection electrode and the collecting electrode can be simultaneously formed by a plating method, and therefore a step of forming the connection electrode can be simplified. By forming the collecting electrode and the connection electrode by a plating method, the resistance of the collecting electrode and the connection electrode can be reduced. As a result, conversion efficiency of the solar cell can be improved. The collecting electrode is electrically connected to a wiring sheet through the connection electrode, and thus it is unnecessary to establish connection by a tab line, so that double-sided electrode type solar cells can be easily modularized.

DESCRIPTION OF EMBODIMENTS

[Solar Cell]

The solar cell of the present invention is so called heterojunction solar cell. Heterojunction solar cell is a crystalline silicon solar cell in which a silicon-based thin-film having a band gap different from that of a single-crystalline silicon substrate is formed on a surface of a conductive single-crystalline silicon substrate to produce a diffusion potential. The silicon-based thin-film is preferably amorphous. In particular, a heterojunction solar cell having a thin intrinsic amorphous silicon layer interposed between a conductive amorphous silicon-based thin-film for forming a diffusion potential and a single-crystalline silicon substrate is known as one configuration of crystalline silicon solar cell with highest conversion efficiency.

Figure 1:
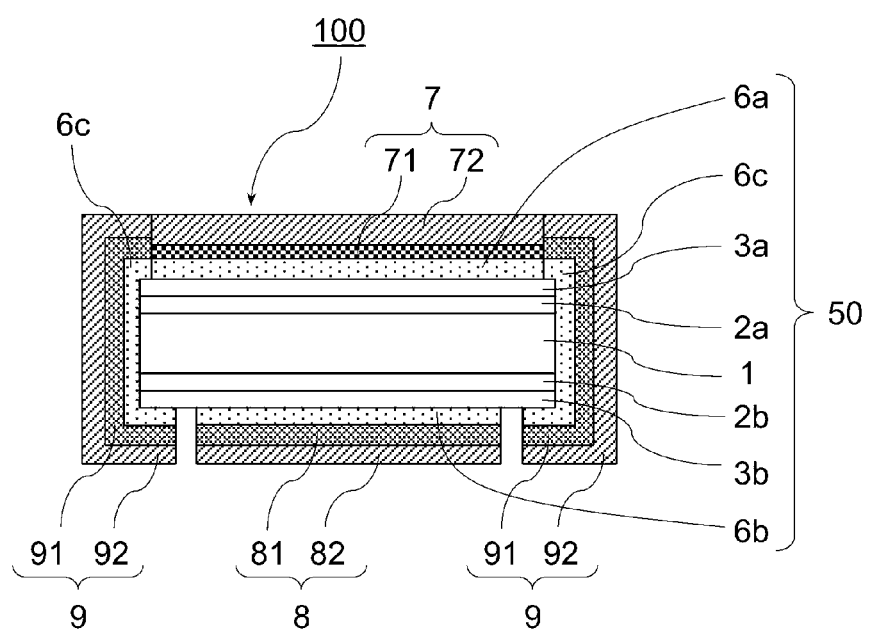
FIG. 1 is a schematic sectional view showing a solar cell according to one embodiment of the present invention.

FIG. 1 is a schematic sectional view showing a solar cell according to one embodiment of the present invention. A solar cell 100 includes a photoelectric conversion section 50 including a first conductivity-type silicon-based thin-film 3a and a first transparent electrode layer 6a in this order on a first principal surface (surface on the light incident side, light-receiving surface) of a substrate 1, and including a second conductivity-type silicon-based thin-film 3b and a second transparent electrode layer 6b in this order on a second principal surface (surface on a side opposite to the first principal surface, i.e., back surface) of the substrate 1. Preferably, the solar cell 100 includes intrinsic silicon-based thin-films 2a and 2b between the substrate 1 and the conductive silicon-based thin-films 3a and 3b, respectively.

In the solar cell 100 shown in FIG. 1, a third transparent electrode layer 6c is provided on a region extending from the peripheral edge of the first conductivity-type silicon-based thin-film 3a through the lateral surface of the substrate 1 to the peripheral edge of the second conductivity-type silicon-based thin-film 3b. The third transparent electrode layer 6c is in electrical continuity with the first transparent electrode layer 6a, and is in electrical non-continuity with the second transparent electrode layer 6b. In this specification, the "peripheral edge" refers to a region including a peripheral end and extending over a predetermined distance (e.g., several tens μm to several mm) from the peripheral end. The "peripheral end" refers to an end edge of a principal surface. The "peripheral end" herein refers to an end edge of the silicon-based thin-film on the principal surface. The area (distance from peripheral end) of the third transparent electrode layer 6c formed on the first conductivity-type silicon-based thin-film 3a may be equal to or different from the area of the third transparent electrode layer 6c formed on the second conductivity-type silicon-based thin-film 3b.

A collecting electrode 7 is provided on the first transparent electrode layer 6a, a back electrode 8 is provided on the second transparent electrode layer 6b, and a connection electrode 9 is provided on the third transparent electrode layer 6c. The connection electrode 9 is in electrical continuity with the collecting electrode 7, and is in electrical non-continuity with the back electrode 8.

In the solar cell 100, the collecting electrode 7 is an electrode for first conductivity-type, and the back electrode 8 is an electrode for second conductivity-type. The "first conductivity-type" is either an n-type or a p-type. This means that the collecting electrode 7 is either an electrode for n-type or an electrode for p-type. The electrode for first conductivity-type is an electrode for collecting carriers on the first conductivity-type layer side of a semiconductor junction of the photoelectric conversion section. The "second conductivity-type" is a conductivity-type different from the "first conductivity-type". For example, when the "first conductivity-type" is p-type, the "second conductivity-type" is n-type.

The collecting electrode 7 includes a first metal seed layer 71 and a first plating layer 72 in this order from the photoelectric conversion section 50 side. The back electrode 8 includes a second metal seed layer 81 and a second plating layer 82 in this order from the photoelectric conversion section 50 side. The back electrode 8 may include only the metal seed layer 81. The connection electrode 9 includes a third metal seed layer 91 and a third plating layer 92 in this order from the photoelectric conversion section 50 side.

As described later, it is preferred that the second metal seed layer 81 and the third metal seed layer 91 are mainly composed of the same material. It is further preferred that the first plating layer 72 and the third plating layer 92 are mainly composed of the same material. The second plating layer 82 may be mainly composed of a material identical to or different from the material of the first plating layer 72 and the third plating layer 92. In this specification, the term "mainly composed of A" means that the content of A is more than 50% by weight, preferably 70% by weight or more, more preferably 85% by weight or more.

Figure 2:
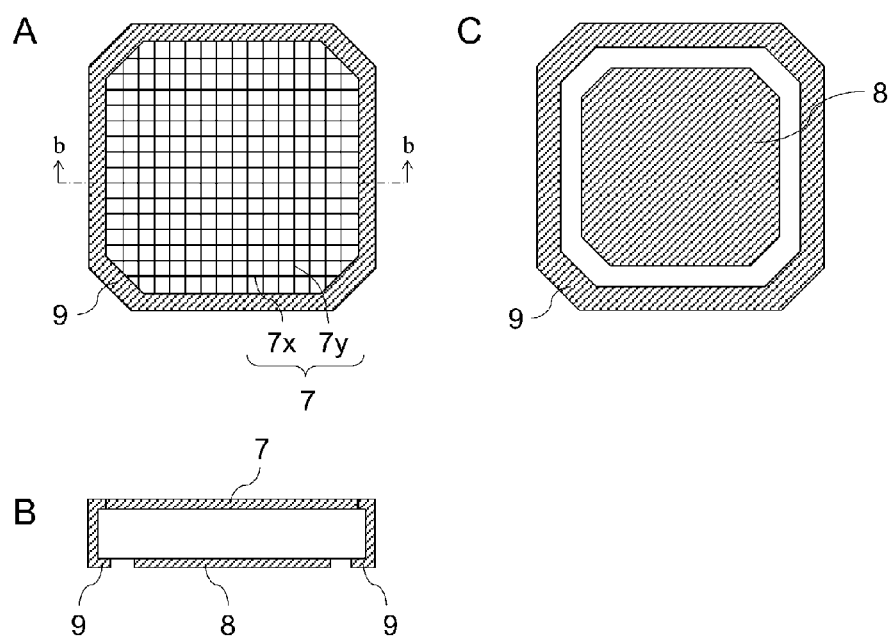
FIG. 2A is a schematic plan view showing first principal surface of a solar cell.
FIG. 2B is a schematic side view showing the solar cell.
FIG. 2C is a schematic plan view showing second principal surface of the solar cell.
Figure 3:
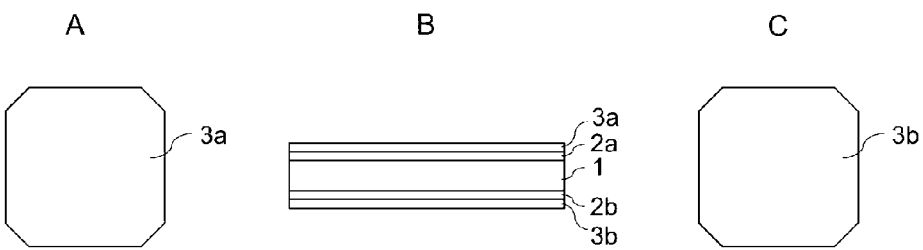
FIG. 3 is an explanatory drawing for explaining an example of method for manufacturing a solar cell.
Figure 4:
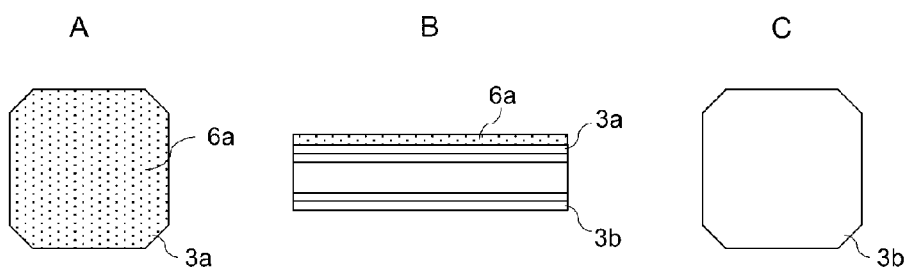
FIG. 4 is an explanatory drawing for explaining an example of method for manufacturing a solar cell.
Figure 5:
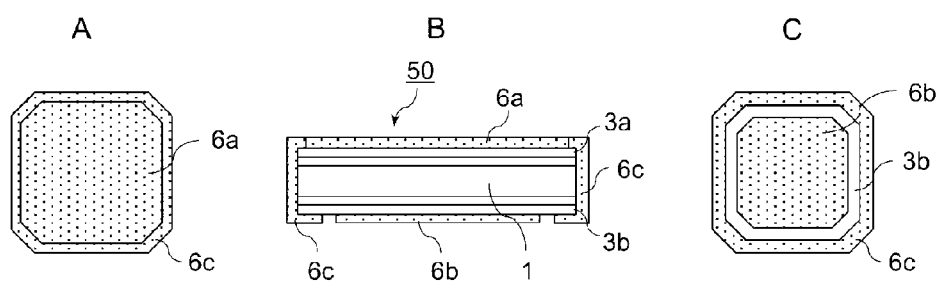
FIG. 5 is an explanatory drawing for explaining an example of method for manufacturing a solar cell.
Figure 6:
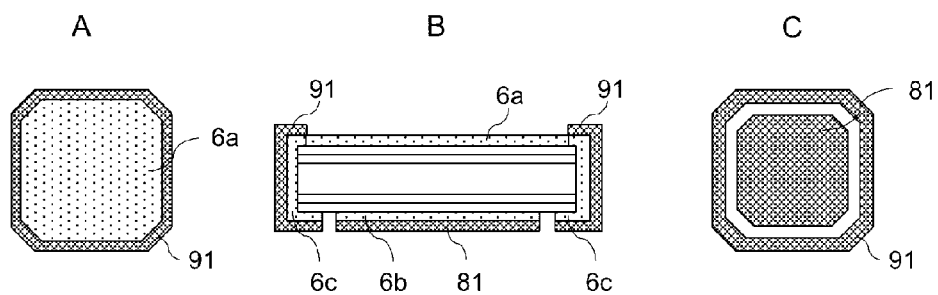
FIG. 6 is an explanatory drawing for explaining an example of method for manufacturing a solar cell.
Figure 7:
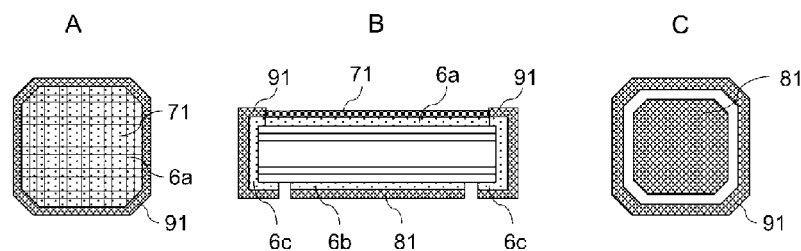
FIG. 7 is an explanatory drawing for explaining an example of method for manufacturing a solar cell.
Figure 8:
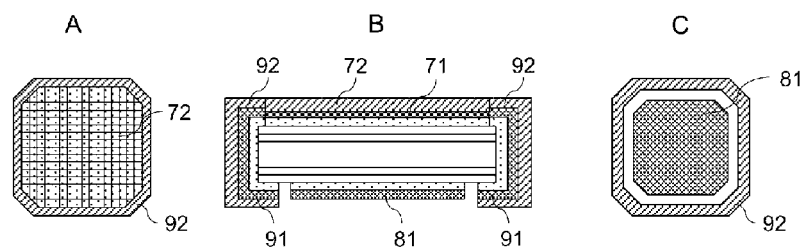
FIG. 8 is an explanatory drawing for explaining an example of method for manufacturing a solar cell.
Figure 9:
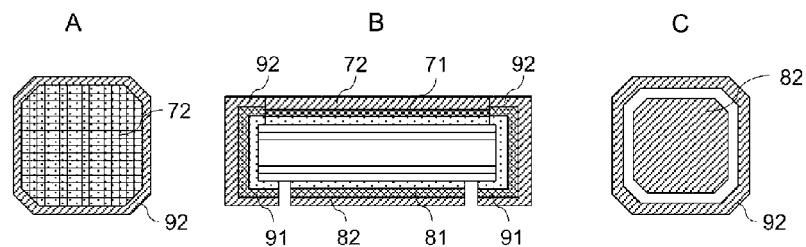
FIG. 9 is an explanatory drawing for explaining an example of method for manufacturing a solar cell.

FIG. 2A is a schematic plan view showing the first principal surface of the solar cell 100, FIG. 2B is a schematic side view showing the solar cell 100, and FIG. 2C is a schematic plan view showing the second principal surface of the solar cell 100. In the example shown in FIGS. 2A to 2C, the connection electrode 9 is provided on a region extending from the peripheral edge of the first principal surface through the lateral surface to the peripheral edge of the second principal surface of the solar cell 100. As described above, the "peripheral edge" refers to a region including a peripheral end and extending over a predetermined distance from the peripheral end. The area (distance from peripheral end) of the connection electrode formed on the first principal surface may be equal to or different from the area of the connection electrode formed on the second principal surface.

The collecting electrode 7 is formed in a predetermined pattern shape on the first principal surface. In the example shown in FIG. 2A, the collecting electrode 7 has a grid-like pattern including a plurality of finger electrodes 7x formed so as to extend in parallel to one another with a spacing between adjacent finger electrodes 7x, and a plurality of finger electrodes 7y formed substantially orthogonal to the finger electrodes 7x. Both ends of each of the finger electrodes 7x and 7y are connected to the connection electrode 9 provided on the peripheral edge of the first principal surface, and thus the collecting electrode 7 and the connection electrode 9 are electrically connected to each other.

The back electrode 8 is in electrical non-continuity with the connection electrode 9. In the example shown in FIG. 2C, the back electrode 8 is formed on the second principal surface in a region other than the peripheral edge so that a spacing is provided between the back electrode 8 and the connection electrode 9. Although the back electrode 8 is preferably formed in a planar shape, the back electrode may be formed in a pattern shape as long as it is insulated from the connection electrode 9.

Preferably, the first transparent electrode layer 6a is formed on substantially the entire surface of the first conductivity-type silicon-based thin-film 3a. In this specification, the "substantially the entire surface" means a region occupying 90% or more of the principal surface. The "substantially the entire surface" herein means a region occupying 90% or more of the area of the silicon-based thin-film on the principal surface. Although the lateral surface of the first transparent electrode layer 6a and the lateral surface of the third transparent electrode layer 6c are in contact with each other in FIG. 1, it is preferable that the transparent electrode layer 6a is formed on substantially the entire surface of the conductive silicon-based thin-film 3a, and the transparent electrode layer 6c is formed so as to overlap the transparent electrode layer 6a. When the first transparent electrode layer 6a and the third transparent electrode layer 6c overlap each other, either one of these layers may be formed over the other.

Preferably, the second transparent electrode layer 6b and the third transparent electrode layer 6c on the second principal surface are formed in conformity with the shapes of the back electrode 8 and the connection electrode 9, respectively. Specifically, it is preferable that the transparent electrode layer 6b is in electrical non-continuity with the transparent electrode layer 6c, and the transparent electrode layer 6b is provided on the back surface in a region other than the peripheral edge so that a spacing is provided between the transparent electrode layer 6b and the transparent electrode layer 6c.

In the solar cell 100 shown in FIG. 1, photocarriers collected in finger electrodes on the first principal surface are extracted to outside through the connection electrode. Accordingly, it is not necessary to provide a bus bar electrode crossing over the first principal surface, and thus a shading loss caused by the collecting electrode on the first principal surface side can be reduced.

[Method for Manufacturing Solar Cell]

A method for manufacturing the solar cell 100 includes the steps of preparing the photoelectric conversion section 50; forming the patterned collecting electrode 7 on the first principal surface of the photoelectric conversion section 50; forming the back electrode 8 on the second principal surface of the photoelectric conversion section 50; and forming the connection electrode 9 on the peripheral edge of the second principal surface of the photoelectric conversion section 50 and the lateral surfaces of the photoelectric conversion section 50. The step of forming the collecting electrode 7 includes the sub-steps of forming the first metal seed layer 71 on the first principal surface of the photoelectric conversion section 50; and forming the first plating layer 72 on the first metal seed layer 71 by a plating method. The step of forming the back electrode 8 includes the sub-step of forming the second metal seed layer 81 on the second principal surface of the photoelectric conversion section 50. The step of forming the back electrode 8 may include the sub-step of forming the second plating layer 82 on the second metal seed layer 81 by a plating method. The step of forming the connection electrode 9 includes the sub-steps of forming the third metal seed layer 91 on the peripheral edge of the second principal surface of the photoelectric conversion section 50 and the lateral surfaces of the photoelectric conversion section 50; and forming the third plating layer 92 on the third metal seed layer 91 by a plating method.

Hereinafter, a preferred embodiment of the method for manufacturing the solar cell 100 shown in FIG. 1 will be described with reference to FIGS. 3 to 9. In each of FIGS. 3 to 9, A shows a schematic plan view of the first principal surface, B shows a schematic side view, and C shows a schematic plan view of the second principal surface.

(Preparation of Photoelectric Conversion Section 50)

As shown in FIGS. 3A to 3C, the first conductivity-type silicon-based thin-film 3a is formed on the first principal surface of the single-crystalline silicon substrate 1, and the second conductivity-type silicon-based thin-film 3b is formed on the second principal surface. One of these conductive silicon-based thin-films has p-type conductivity, and the other has n-type conductivity.

The conductivity-type of the single-crystalline silicon substrate 1 may be either an n-type or a p-type. Since comparison between a hole and an electron shows that the electron has a high mobility, high conversion characteristics are exhibited particularly when the silicon substrate 1 is an n-type single-crystalline silicon substrate. The silicon substrate 1 has a texture on at least the first principal surface, preferably on both surfaces. The texture is formed using, for example, an anisotropic etching technique. A texture formed by anisotropic etching has a quadrangular pyramid-shaped irregularity structure.

Although the thickness of the silicon substrate 1 is not particularly limited, it is preferably 10 µm to 150 µm, more preferably 30 µm to 120 µm. When the thickness of the silicon substrate is 150 µm or less, the use amount of silicon is reduced, and therefore the cost can be reduced. As the thickness of the silicon substrate decreases, recombination of photocarriers in the silicon substrate is reduced, and therefore the open circuit voltage (Voc) of the solar cell tends to be improved. The thickness of the silicon substrate is defined by a distance between the peak of a projection in the texture on the surface and the peak of a projection on the second principal surface.

Preferably, intrinsic silicon-based thin-films 2a and 2b are formed between the single-crystalline silicon substrate 1 and the conductive silicon-based thin-films 3a and 3b, respectively as shown in FIGS. 3A to 3C. By providing an intrinsic silicon-based thin-film on a surface of a single-crystalline silicon substrate, surface can be effectively passivated and diffusion of impurities to the single-crystalline silicon substrate is suppressed. The intrinsic silicon-based thin-films 2a and 2b are preferably intrinsic amorphous silicon thin-films for effectively performing surface passivation of the single-crystalline silicon substrate 1.

Deposition method for forming silicon-based thin-films 2a and 2b is preferably a plasma-enhanced CVD method. Deposition conditions used for forming silicon-based thin-films by a plasma-enhanced CVD method are preferably as follows: a substrate temperature of 100 to 300° C.; a pressure of 20 to 2600 Pa; and a high-frequency power density of 0.004 to 0.8 W/cm$^2$. A source gas used to form the silicon-based thin-films is preferably a mixed gas of $H_2$ and silicon-containing gas such as $SiH_4$ or $Si_2H_6$.

As the conductive silicon-based thin-films 3a and 3b, amorphous silicon, microcrystalline silicon (material including amorphous silicon and crystalline silicon), amorphous silicon alloy and microcrystalline silicon alloy may be used. Examples of the silicon alloy include silicon oxide, silicon carbide, silicon nitride silicon germanium and the like. Among the above, conductive silicon-based thin-film are preferably an amorphous silicon thin-film.

As with the intrinsic silicon-based thin-films 2a and 2b, the conductive silicon-based thin-films 3a and 3b are preferably deposited by a plasma-enhanced CVD method. In deposition of a conductive silicon-based thin-film, a dopant gas such as $B_2H_6$ or $PH_3$ is used for adjusting conductivity type (p-type or n-type). The amount of conductivity-type determining impurity is sufficient to be a trace amount; thus, it is preferred to use a mixed gas diluted with $SiH_4$ or $H_2$ beforehand. When a gas containing a different element, such as $CH_4$, $CO_2$, $NH_3$ or $GeH_4$, is added thereto in deposition of the conductive silicon-based thin-film, silicon is alloyed so that the energy gaps of the conductive silicon-based thin-films can be changed.

The transparent electrode layer 6a is formed on the first conductivity-type silicon-based thin-film 3a (FIGS. 4A to 4C). Preferably, the transparent electrode layer 6a is formed on substantially the entire surface of the first conductivity-type silicon-based thin-film 3a.

The transparent electrode layer 6b is formed on the second conductivity-type silicon-based thin-film 3b, and the transparent electrode layer 6c is formed on the peripheral edge of the second conductivity-type silicon-based thin-film 3b and the lateral surfaces of the substrate 1 (FIGS. 5A to 5C). In this way, the photoelectric conversion section 50 is prepared. The transparent electrode layer 6c may also be formed on the peripheral edge of the first conductivity-type silicon-based thin-film 3a as shown in FIGS. 5A and 5B. The transparent electrode layer 6b is provided in such a manner that it is in electrical non-continuity with the transparent electrode layer 6c. Specifically, it is preferable that the transparent electrode layer 6b is provided on the second conductivity-type silicon-based thin-film 3b in a region other than the peripheral edge so that a spacing is provided between the transparent electrode layer 6b and the transparent electrode layer 6c.

Preferably, the transparent electrode layers 6a, 6b and 6c are mainly composed of a conductive oxide. As the conductive oxide, for example, zinc oxide, indium oxide, tin oxide and the like can be used singly, or as a composite oxide. From the viewpoint of conductivity, optical properties and long-term reliability, an indium-based oxide is preferable, and in particular, an indium-based oxide mainly composed of indium tin oxide (ITO) is more preferably used. The thickness of each of the transparent electrode layers 6a and 6b is preferably 10 nm or more and 140 nm or less from the viewpoint of transparency, conductivity and reduction of light reflection.

These transparent electrode layers are deposited by a dry process (a CVD method, or a PVD method such as a sputtering method or an ion plating method). A PVD method such as a sputtering method or an ion plating method is preferable for deposition of a transparent electrode layer mainly composed of an indium-based oxide.

Preferably, the transparent electrode layers 6b and 6c are formed using a mask. Specifically, it is preferable that a mask is provided on the second principal surface of the photoelectric conversion section 50, and the transparent electrode layers are deposited from the second principal surface side in a state where an insulating region between the transparent electrode layers 6b and 6c is shielded with the mask. In this case, the transparent electrode layers 6b and 6c can be formed simultaneously, and an electrode layer non-formed region can be provided between the transparent electrode layers 6b and 6c.

In the example shown in FIGS. 5A to 5C, the transparent electrode layer 6c is formed on the lateral surfaces and the peripheral edge on the first principal surface of the substrate, as well as on the peripheral edge on the second principal surface, due to wraparound during deposition of the layer. Accordingly, the transparent electrode layer 6c is connected to the transparent electrode layer 6a.

Although it is preferable from the viewpoint of productivity that the transparent electrode layers 6b and 6c are formed simultaneously using a mask as described above, the transparent electrode layers 6b and 6c may be formed in separate steps. A mask may be used in deposition of the transparent electrode layer 6a, although deposition without using a mask is preferred. The transparent electrode layer 6a and the transparent electrode layer 6b are formed in such a manner that they are not in contact with each other, irrespective of whether a mask is used or not in deposition.

(Formation of Metal Seed Layer)

As shown in FIGS. 6A to 6C, the metal seed layer 81 is formed on the transparent electrode layer 6b, and the metal seed layer 91 is formed on the transparent electrode layer 6c. The metal seed layers 81 and 91 are formed on substantially the entire surface of the transparent electrode layer 6b and substantially the entire surface of the transparent electrode layer 6c, respectively.

Examples of the method for forming the metal seed layers 81 and 91 on substantially the entire surface of the transparent electrode layer 6b and substantially the entire surface of the transparent electrode layer 6c include dry processes such as various kinds of PVD methods and CVD methods, application of a paste, and a plating method. As a material of the metal seed layers 81 and 91, one having a high reflectance to light in a near-infrared to infrared range, and high conductivity and chemical stability are preferably used. Examples of the material having the above-mentioned characteristics include silver, copper and aluminum.

It is preferable that the metal seed layers 81 and 91 are deposited using a mask, like the deposition of the transparent electrode layers 6b and 6c. Specifically, it is preferable that using the same mask as in deposition of the transparent electrode layers 6b and 6c, a metal layer is deposited from the second principal surface side in a state where an insulating region between the metal seed layer 81 and the metal seed layer 91 is shielded with the mask. In this case, the metal seed layers 81 and 91 mainly composed of the same material can be formed simultaneously. By using a mask, a metal layer non-formed region is provided between the metal seed layers 81 and 91.

In the example shown in FIGS. 6A to 6C, the metal seed layer 91 on the lateral surfaces and the peripheral edge on the first principal surface side of the photoelectric conversion section, as well as on the peripheral edge on the second principal surface side, due to wraparound during deposition of the layer. Accordingly, the metal seed layer 91 is connected to the transparent electrode layer 6a.

Although it is preferable that the metal seed layers 81 and 91 are formed simultaneously using a mask as described above from the viewpoint of productivity, the metal seed layers 81 and 91 may be formed in separate steps.

As shown in FIGS. 7A to 7C, the patterned metal seed layer 71 is formed on the transparent electrode layer 6a. The patterned metal seed is formed by, for example, applying an electroconductive paste by inkjet printing, screen printing, spraying or the like. From the viewpoint of productivity, screen printing is preferable. In screen printing, a process of applying an electroconductive paste composed of metal particles and a resin binder by screen printing is preferably used.

(Formation of Plating Layer)

As shown in FIGS. 8A to 8C, the plating layer 72 is formed by a plating method with the metal seed layer 71 as an origination point. Accordingly, the collecting electrode 7 including the metal seed layer 71 and the plating layer 72 is formed. Preferably, an insulating layer is formed on the transparent electrode layer 6a for suppressing deposition of a metal on the transparent electrode layer 6a.

Preferably, the plating layer 72 is formed by an electroplating method from the viewpoint of productivity. In the electroplating method, the deposition rate of a metal can be increased, and the plating layer 72 can be formed in a short time. In the electroplating method, a substrate provided with a metal seed layer and an anode (electrode for plating) are immersed in a plating solution, and a voltage is applied between the substrate and the anode to deposit a metal on the metal seed layer.

In the present invention, it is preferable to supply electricity to the metal seed layer 91 that is in electrical continuity with the metal seed layer 71. By supplying electricity to the metal seed layer 91, the plating layers 92 and 72 can be formed simultaneously on the metal seed layer 91 and the metal seed layer 71. Thus, the plating layer 72 and the plating layer 92 are mainly composed of the same material. As a result, the collecting electrode 7 including the metal seed layer 71 and the plating layer 72, and the connection electrode 9 including the metal seed layer 91 and the plating layer 92 are formed simultaneously.

When a collecting electrode including only finger electrodes is formed by a plating method, it is difficult to provide an electricity supply point on the metal seed layer of the finger electrode because the finger electrode is thinner than the bus bar electrode. Although making the electrode pattern of the collecting electrode as thin as possible is preferred for reducing a shading loss on the first principal surface, it becomes more difficult to supply electricity to the first principal surface (metal seed layer 71) as the collecting electrode is thinned. In contract, by supplying electricity to the lateral surface (metal seed layer 91), the plating layer 72 can be formed on the metal seed layer 71, as well as the plating layer 92 being formed on the metal seed layer 91. Further, by supplying electricity to the lateral surface (metal seed layer 91), the thickness of the plating layer 72 can be made uniform because electricity is stably fed to the metal seed layer 71 even when the metal seed layer 71 on the first principal surface side is thinned. As a result, the collecting electrode 7 having a uniform thickness can be formed.

Generally, a metal oxide that forms a transparent electrode layer is easily dissolved in a plating solution. In the above-mentioned method, the transparent electrode layer is covered with a metal seed layer or an insulating layer, and therefore dissolution of the transparent electrode layer during plating can be suppressed.

Figure 10:
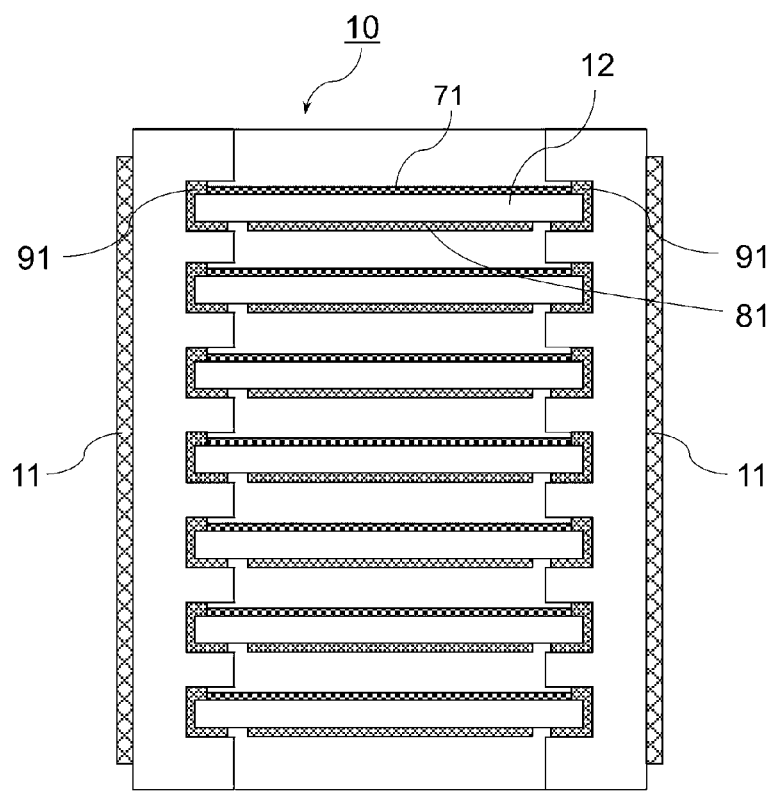
FIG. 10 is a schematic plan view showing a state in which a substrate is placed in a cassette to be used in an electroplating method.

When the collecting electrode is formed by an electroplating method, for example, a cassette 10 as shown in FIG. 10 can also be used. The cassette 10 is capable of storing a plurality of substrates 12, and an electricity supply member 11 is provided on a region that is in contact with both lateral surfaces (metal seed layer 91) of the substrate 12. As shown in FIG. 10, a plurality of substrates 12 each provided with a metal seed layer is disposed at substantially equal intervals and substantially in parallel to one another in the cassette 10 in such a manner that principal surfaces face one another, and the cassette 10 is then immersed in a plating solution. Electricity can be uniformly supplied through the electricity supply member 11 to the metal seed layer 91 of each of a plurality of substrates, and therefore the thickness of each of the plating layers 92 and 72 formed on the metal seed layers 91 and 71 can be made uniform.

Electricity can be supplied to the metal seed layer 71 in addition to supplying electricity to the metal seed layer 91.

For example, when the cassette 10 is used, an electricity supply member may be further provided on a region that is in contact with the first principal surface (metal seed layer 71) of the substrate 12. Electricity may be supplied to only the metal seed layer 71.

The metal seed layer and the plating solution are required to be in electrical continuity with each other for forming the plating layer 72 on the metal seed layer 71 by a plating method. Thus, it is required to provide an opening in the insulating layer on the metal seed layer 71. Examples of the method for forming an opening in the insulating layer include patterning the insulating layer using a resist. An opening may be formed in the insulating layer by a method such as laser irradiation, mechanical drilling or chemical etching.

In addition to the above-mentioned method, for example, the following techniques can be employed as methods for forming a plating layer through an opening in the insulating layer.

An insulating layer is formed on a transparent electrode, a groove extending through the insulating layer is then provided to expose a surface or a lateral surface of the transparent electrode layer, a metal seed layer is deposited on the exposed surface of the transparent electrode layer by photo-plating or the like, and a plating layer is then formed by plating with the metal seed as an origination point (see Japanese Patent Laid-open Publication No. 2011-199045).

When an insulating layer is formed on a metal seed layer having irregularities, the insulating layer is discontinuous, and therefore an opening is formed. A plating layer is formed by plating with the opening as an origination point (WO 2011/045287).

After formation or during formation of an insulating layer on a metal seed layer containing a low-melting-point material, the low-melting-point material is thermally fluidized by heating to form an opening in the insulating layer on the metal seed layer, and a plating layer is formed by plating with the opening as an origination point (WO2013/077038).

A self-assembled monomolecular film is formed as an insulating layer, and the self-assembled monomolecular film on a metal seed layer is separated and removed to form an opening in the insulating layer (the metal seed layer is exposed). A plating layer is formed by plating with the exposed metal seed layer as an origination point (WO 2014/097829). In this method, deposition of the plating layer on the transparent electrode layer is suppressed because the self-assembled monomolecular film is formed on the transparent electrode layer.

These methods are more advantageous in material cost and process cost because use of a resist is not required. A low-resistance metal seed layer is provided, and thus contact resistance between the transparent electrode layer and the collecting electrode can be reduced.

As shown in FIGS. 9A to 9C, the plating layer 82 may be formed by a plating method with the metal seed layer 81 as an origination point. Accordingly, the back electrode 8 including the metal seed layer 81 and the plating layer 82 is formed.

When a back electrode is formed by a plating method, it is preferable that electricity is supplied to the metal seed layer 81 after completion of supply of electricity for formation of the collecting electrode 7 (supply of electricity to the metal seed layer 91 and/or the metal seed layer 71). Supply of electricity for formation of the collecting electrode 7 and supply of electricity to the metal seed layer 81 may be performed simultaneously, or electricity may be supplied to the metal seed layer 81 before supply of electricity for formation of the collecting electrode 7.

The solar cell 100 can be manufactured through the above steps. The manufacturing the solar cell 100 is not necessarily carried out in the sequence of FIGS. 3 to 9. For example, the transparent electrode layer 6a on the first principal surface may be formed after formation of the transparent electrode layer 6b and the transparent electrode layer 6c from the second principal surface side. For example, the transparent electrode layer 6a on the first principal surface side may be formed after formation of the metal seed layer 81 and the metal seed layer 91 from the second principal surface side.

Although the back electrode 8 includes the metal seed layer 81 and the plating layer 82 in the example described above, the metal seed layer 81 alone can serve as the back electrode 8. Therefore, formation of the plating layer 82 shown in FIGS. 9A to 9C may be omitted.

In the example described above, the metal seed layer 71 and the metal seed layer 91 are provided in contact with each other, and the transparent electrode layer 6a and the transparent electrode layer 6c are provided in contact with each other. When the metal seed layer 71 and the metal seed layer 91 are in electrical continuity with each other, the plating layers 72 and 92 can be formed simultaneously. Thus, at least one of the metal seed layer 71 and the transparent electrode layer 6a only needs to be formed in contact with at least one of the metal seed layer 91 and the transparent electrode layer 6c. When the metal seed layer 71 and the metal seed layer 91 are in electrical continuity with each other, formation of the transparent electrode layer 6c on the lateral surface of the substrate 1 is not required, or formation of the transparent electrode layer 6c itself is not required. In this case, it suffices that at least one of the metal seed layer 71 and the transparent electrode layer 6a is formed in contact with the metal seed layer 91.

The method for forming the patterned collecting electrode 7 is not limited to a method in which the patterned metal seed layer 71 is formed on the transparent electrode layer 6a, and the plating layer 72 is formed thereon as described above. The collecting electrode may be formed using a resist. When a resist is used, a plating layer can be formed on the metal seed layer 71 by, for example, the following method. First, the metal seed layer 71 is formed on substantially the entire surface of the transparent electrode layer 6a, and a resist layer having an opening conforming to the shape of the collecting electrode is then formed. The plating layer 72 is formed in the resist opening region where the metal seed layer 71 is exposed. Thereafter, the resist layer is removed, and the metal seed layer 71 is removed in a region where the plating layer 72 is not formed thereon. In this way, the patterned collecting electrode 7 is formed.

[Solar Cell Module]

Preferably, the solar cell of the present invention is encapsulated by an encapsulant to be modularized in practical use. Modularization of the solar cell is performed by an appropriate method. The configuration of the solar cell module is not particularly limited. It is preferable that the solar cell is connected to other solar cell or an external circuit through a wiring sheet.

Figure 11:
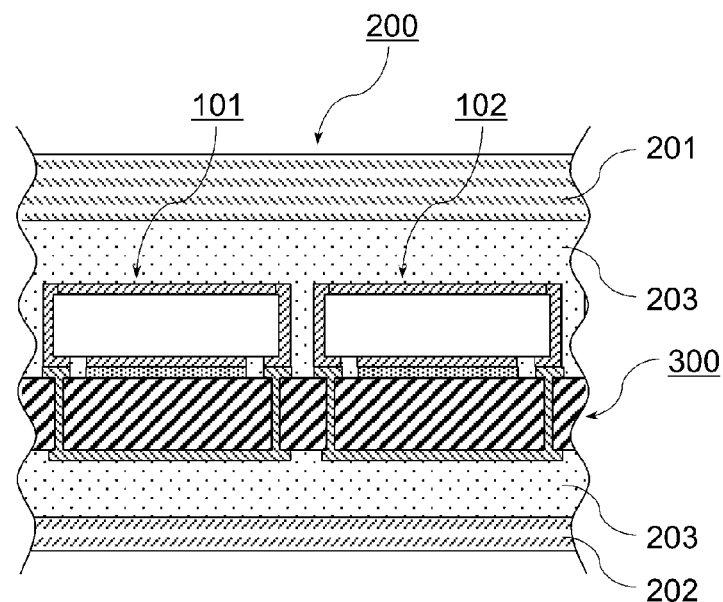
FIG. 11 is a schematic sectional view showing a solar cell module according to one embodiment.

FIG. 11 is a schematic sectional view showing a solar cell module according to one embodiment. A solar cell module 200 shown in FIG. 11 includes a first solar cell 101 and a second solar cell 102. The solar cells 101 and 102 are connected in series by a wiring sheet 300 provided in contact with the back side of each of the first solar cell and the second solar cell.

Protecting members 201 and 202 are disposed on the light-receiving side and the back side, respectively, of each of the solar cells 101 and 102. An encapsulant 203 is provided between the protecting member 201 on the light-receiving side and the protecting member 202 on the back side, and the solar cells 101 and 102 are encapsulated by the encapsulant 203.

In preparation of the solar cell module, a solar cell with a wiring sheet is first prepared by mutually connecting a plurality of solar cells through the wiring sheet 300. The solar cell with a wiring sheet is sandwiched between the protecting member 201 on the light-receiving side and the protecting member 202 on the back side with the encapsulant 203 interposed between each of the protecting members and the solar cell with a wiring sheet, thereby forming the solar cell module. It is preferable that the encapsulant 203, the solar cell with a wiring sheet, the encapsulant 203 and the protecting member 202 on the back side are sequentially stacked on the protecting member 201 on the light-receiving side to form a laminated body as shown in FIG. 11. Preferably, the laminated body is then heated under an appropriate condition to cure the encapsulant 203. An aluminum frame (not illustrated) etc. is attached to prepare the solar cell module 200.

Preferably, the protecting member 201 on the light-receiving side is disposed on the light-receiving side (light-incident side) of each of the solar cells 101 and 102 to protect the surface of the solar cell module. As the protecting member on the light-receiving side, light-transmissive and water-permeable material such as glass or light-transmissive plastic can be used. Preferably, the protecting member 202 on the back side is disposed on the back side of each of the solar cells 101 and 102 to protect the back surface of the solar cell module. As the protecting member on the back side, a resin film of polyethylene terephthalate (PET) or the like, or a laminated film having a structure in which an aluminum foil is sandwiched between resin films can be used.

Between the protecting member 201 on the light-receiving side and the protecting member 202 on the back side, the solar cell with a wiring sheet is encapsulated with the encapsulant 203. The kind of the encapsulant disposed between the protecting member on the light-receiving side and the solar cell may be identical to or different from the kind of the encapsulant disposed between the protecting member on the back side and the solar cell. As the encapsulant, a light-transmissive resin such as an ethylene-vinyl acetate copolymer resin (EVA), an ethylene-ethyl acrylate copolymer resin (EEA), a polyvinyl butyral resin (PVB), silicon, an urethane resin, an acrylic resin or an epoxy resin can be used. An olefin-based encapsulant can also be used as the encapsulant 203. The olefin-based encapsulant has a water vapor transmission rate lower than that of an encapsulant composed of EVA or the like, and is therefore capable of suppressing ingress of water into the module. As a material of the olefin-based encapsulant, either a non-crosslinked olefin or a crosslinked olefin can be used.

The solar cell module 200 can be prepared in the manner described above. The basic configuration of the solar cell module and the method for preparation of the solar cell module are not limited to those described above.

[Electrical Connection of Solar Cell and Wiring Sheet]

Figure 12:
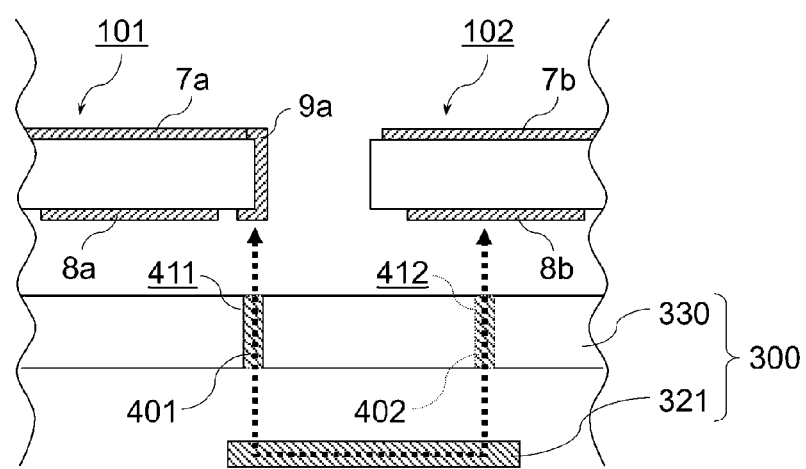
FIG. 12 is a schematic view for explaining electrical connection of a solar cell and a wiring sheet.

FIG. 12 is a schematic view for explaining electrical connection of a solar cell and a wiring sheet. FIG. 12 illustrates a part of the configuration shown in FIG. 11, which is involved in electrical connection of the solar cell and the wiring sheet.

Like the solar cell 100 shown in FIG. 1, the solar cells 101 and 102 shown in FIG. 12 include collecting electrodes 7a and 7b, respectively, provided on the light-receiving surface and back electrodes 8a and 8b, respectively, provided on the back surface. The solar cells 101 and 102 are disposed in such a manner that the back electrodes 8a and 8b face the first principal surface of the wiring sheet 300. The first solar cell 101 further includes a connection electrode 9a. The connection electrode 9a is connected to the collecting electrode 7a, and insulated from the back electrode 8a.

In the solar cells 101 and 102, the collecting electrodes 7a and 7b are each an electrode for first conductivity-type, and the back electrodes 8a and 8b are each an electrode for second conductivity-type. The first conductivity-type of the solar cell 101 and the first conductivity-type of the solar cell 102 are the same conductivity-type. Thus, when the solar cell 101 has a p-type conductivity on the light-receiving side, the solar cell 102 also has a p-type conductivity on the light-receiving side.

The wiring sheet 300 includes an insulating base 330 provided with a first through-hole 411 and a second through-hole 412. A first electrical continuity section 401 and a second electrical continuity section 402 are formed in the first through-hole 411 and the second through-hole 412, respectively, by, for example, filling these through-holes with an electroconductive material. A first back-surface wiring line 321 is provided on a second principal surface of the insulating base 330.

As shown in FIG. 12, the first back-surface wiring line 321 is formed in such a manner that the first electrical continuity section 401 and the second electrical continuity section 402 are in electrical continuity with each other. The first electrical continuity section 401 is in electrical continuity with the connection electrode 9a of the first solar cell 101, and the second electrical continuity section 402 is in electrical continuity with the back electrode 8b of the second solar cell 102. As a result, the collecting electrode 7a of the first solar cell 101 and the back electrode 8b of the second solar cell 102 are in electrical continuity with each other through the connection electrode 9a, the first electrical continuity section 401, the first back-surface wiring line 321 and the second electrical continuity section 402, so that the first solar cell 101 and the second solar cell 102 are connected in series.

Figure 13:
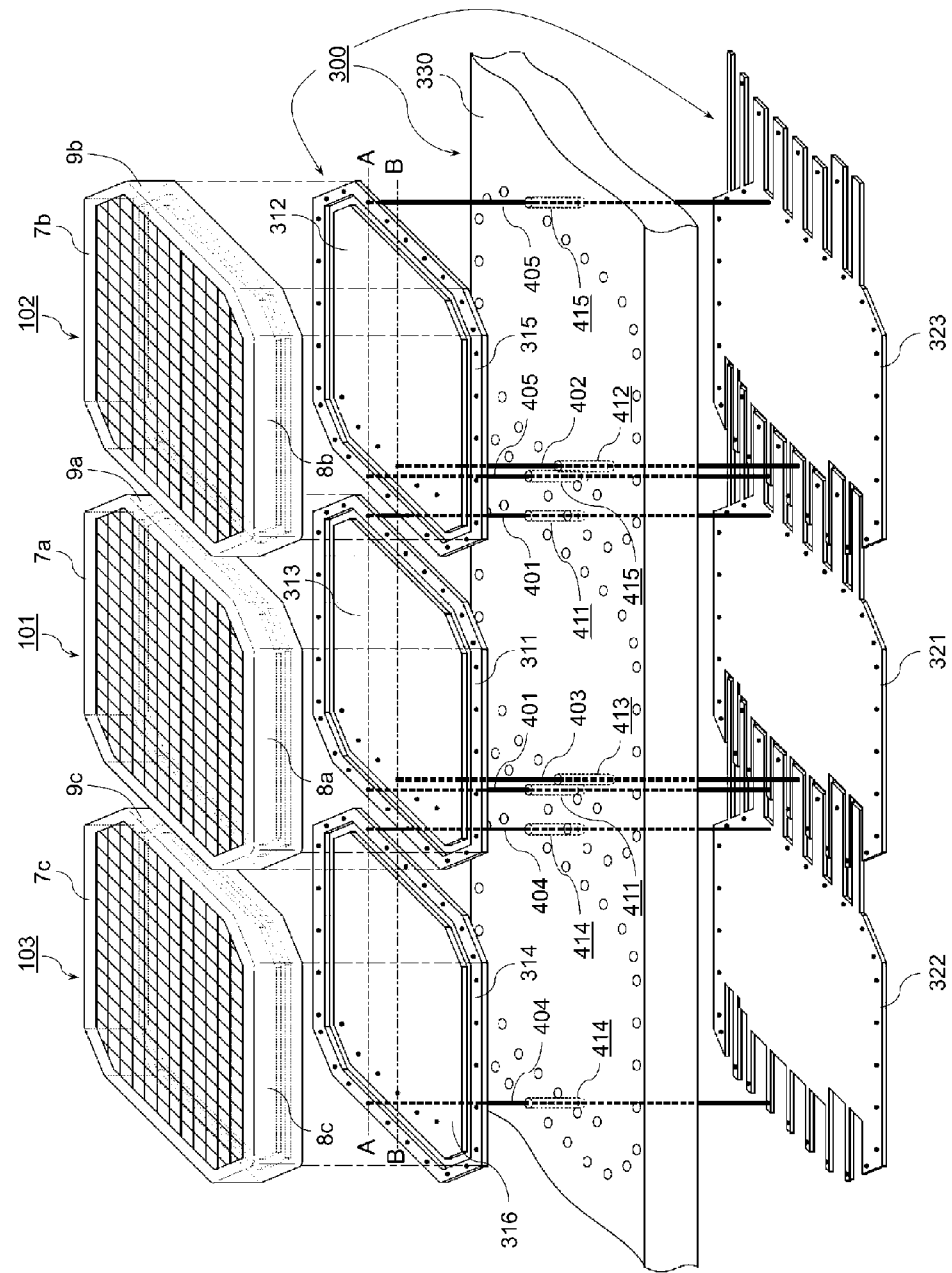
FIG. 13 is an exploded perspective view showing one embodiment of electrical connection of a solar cell and a wiring sheet.

FIG. 13 is an exploded perspective view showing one embodiment of electrical connection of a solar cell and a wiring sheet which form a solar cell module. In FIG. 13, a third solar cell 103 is illustrated in addition to the solar cells 101 and 102. In the embodiment shown in FIG. 13, the wiring sheet 300 includes a second back-surface wiring line 322, a third back-surface wiring line 323 and front-surface wiring lines 311 to 316 in addition to the insulating base 330 and the first back-surface wiring line 321.

Like the first solar cell 101, the third solar cell 103 includes a collecting electrode 7c provided on the light-receiving surface, a back electrode 8c provided on the back surface, and a connection electrode 9c. In the third solar cell 103, the collecting electrode 7c is an electrode for first conductivity-type, and the back electrode 8c is an electrode for second conductivity-type. The first conductivity-types of the solar cells 101 to 103 are the same conductivity-type. The solar cells 101, 102 and 103 are disposed in such a manner that the back electrodes 8a, 8b and 8c face the first principal surface of the wiring sheet 300.

In FIG. 13, the insulating base 330 of the wiring sheet 300 has a plurality of through-holes 411 to 415 as with the embodiment shown in FIG. 12. A first electrical continuity section 401, a second electrical continuity section 402, a third electrical continuity section 403, a fourth electrical continuity section 404 and a fifth electrical continuity section 405 are formed in the first through-hole 411, the second through-hole 412, the third through-hole 413, the fourth through-hole 414 and the fifth through-hole 415, respectively, by, for example, filling these through-holes with an electroconductive material. Back-surface wiring lines 321 to 323 are provided on the second principal surface of the insulating base 330, and front-surface wiring lines 311 to 316 are provided on the first principal surface of the insulating base 330. The back-surface wiring lines 321 to 323 are formed in such a manner that they are insulated from one another (they are in electrical non-continuity with one another).

In FIG. 13, the first front-surface wiring line 311 is in electrical continuity with the first back-surface wiring line 321 through the first electrical continuity section 401 of the wiring sheet 300 (line A-A), and the second front-surface wiring line 312 is in electrical continuity with the first back-surface wiring line 321 through the second electrical continuity section 402 of the wiring sheet 300 (line B-B). The connection electrode 9a of the first solar cell 101 is connected to the first front-surface wiring line 311, and the back electrode 8b of the second solar cell 102 is connected to the second front-surface wiring line 312. As a result, the collecting electrode 7a of the first solar cell 101 and the back electrode 8b of the second solar cell 102 are in electrical continuity with each other through the connection electrode 9a, the first front-surface wiring line 311, the first electrical continuity section 401, the first back-surface wiring line 321, the second electrical continuity section 402 and the second front-surface wiring line 312.

The third front-surface wiring line 313 is in electrical continuity with the second back-surface wiring line 322 through the third electrical continuity section 403 of the wiring sheet 300 (line B-B), and the fourth front-surface wiring line 314 is in electrical continuity with the second back-surface wiring line 322 through the fourth electrical continuity section 404 of the wiring sheet 300 (line A-A). The back electrode 8a of the first solar cell 101 is connected to the third front-surface wiring line 313, and the connection electrode 9c of the third solar cell 103 is connected to the fourth front-surface wiring line 314. As a result, the back electrode 8a of the first solar cell 101 and the collecting electrode 7c of the third solar cell 103 are in electrical continuity with each other through the third front-surface wiring line 313, the third electrical continuity section 403, the second back-surface wiring line 322, the fourth electrical continuity section 404, the fourth front-surface wiring line 314 and the connection electrode 9c.

Thus, the collecting electrode 7a of the first solar cell 101 is in electrical continuity with the back electrode 8b of the second solar cell 102, and the back electrode 8a of the first solar cell 101 is in electrical continuity with the collecting electrode 7c of the third solar cell 103. Accordingly, the solar cells 101, 102 and 103 are connected in series.

In FIG. 13, the fifth front-surface wiring line 315 is in electrical continuity with the third back-surface wiring line 323 through the fifth electrical continuity section 405 of the wiring sheet 300 (line A-A). The connection electrode 9b of the second solar cell 102 is connected to the fifth front-surface wiring line 315 to bring the collecting electrode 7b of the second solar cell 102 into electrical contact with other solar cell or an external circuit (not shown in FIG. 13). Similarly, the back electrode 8c of the third solar cell 103 is connected to the sixth front-surface wiring line 316 to bring the back electrode 8c of the third solar cell 103 into electrical contact with other solar cell or an external circuit.

As shown in FIG. 13, the wiring sheet 300 includes a front-surface wiring line on the first principal surface immediately below the connection electrode and the back electrode of the solar cell, and thus the connection electrode and the back electrode can be electrically connected to the electrical continuity section of the wiring sheet through the front-surface wiring line. Therefore, the solar cell and the wiring sheet can be easily connected to each other. Preferably, pattern shape of the front-surface wiring line of the wiring sheet 300 is formed so as to conformity to the pattern shape of the back electrode and the connection electrode of the solar cell. The front-surface wiring line 311 is provided so as to be insulated from the front-surface wiring line 313. Preferably, the front-surface wiring line 311 is continuously formed so as to surround the periphery of the front-surface wiring line 313 with a spacing therebetween. The same applies to the relationship between the front-surface wiring lines 312 and 315 and the relationship between the front-surface wiring lines 314 and 316.

By using the wiring sheet 300 shown in FIG. 13, the collecting electrode on the light-receiving side of the solar cell and the back electrode of the adjacent solar cell are electrically connected to each other through the electrical continuity section in the through-hole provided in the wiring sheet, and the front-surface wiring line and the back-surface wiring line of the wiring sheet, so that a plurality of solar cells can be connected in series.

[Wiring Sheet]

The wiring sheet that forms the solar cell module of the present invention can be manufactured in the following manner, for example. First, an insulating base is provided. The insulating base is not particularly limited as long as it is electrically insulating, and for example, a hard material such as a glass plate or an epoxy resin plate, a resin film such as a polyethylene terephthalate (PET) film, a polyethylene naphthalate (PEN) film or a polyimide (PI) film, or the like can be used. The thickness of the insulating base is not particularly limited, and may be selected within a range of about 10 µm to 5 mm according to the properties of the material, and so on.

At a predetermined position in the insulating base, a through-hole is formed, and an electrical continuity section is formed. The method for forming a through-hole is not particularly limited, and examples thereof include methods such as laser drilling and mechanical drilling. Examples of the method for forming an electrical continuity section include filling an electroconductive paste in a through-hole and a through-hole plating.

A back-surface wiring line is formed on a principal surface on the back side, and a front-surface wiring line is formed on a principal surface on the light-receiving side of an insulating base as necessary. The wiring materials of the front-surface wiring line and the back-surface wiring line are not particularly limited as long as they are electrical conductive, and for example, copper, aluminum, silver or the like can be used. The front-surface wiring line and the back-surface wiring line may have one layer, or two or more layers. The method for forming a wiring pattern on the base is not particularly limited, and examples thereof include a subtractive method and a semi-additive method which are used in preparation of a printed wiring board.

OTHER EMBODIMENTS

A solar cell according to a preferred embodiment of the present invention, and a solar cell module including the solar cell have been described above. The present invention is not limited to the embodiment described above. As a configuration of the solar cell (e.g., collecting electrode, back electrode and shape of back electrode), any configuration can be employed as long as the effect of the present invention is obtained. As a configuration of the solar cell module (e.g., electrical connection of solar cells, and configuration of wiring sheet), any configuration can be employed.

The wiring sheet of the present invention is also applicable to modularization of solar cells other than heterojunction solar cells. The wiring sheet of the present invention is applicable for interconnection of a plurality of solar cells that are interconnected by a wiring line. Such type of solar cells include crystalline silicon solar cells, and solar cells including a semiconductor substrate composed of a material other than silicon, e.g., GaAs.

Figure 14:
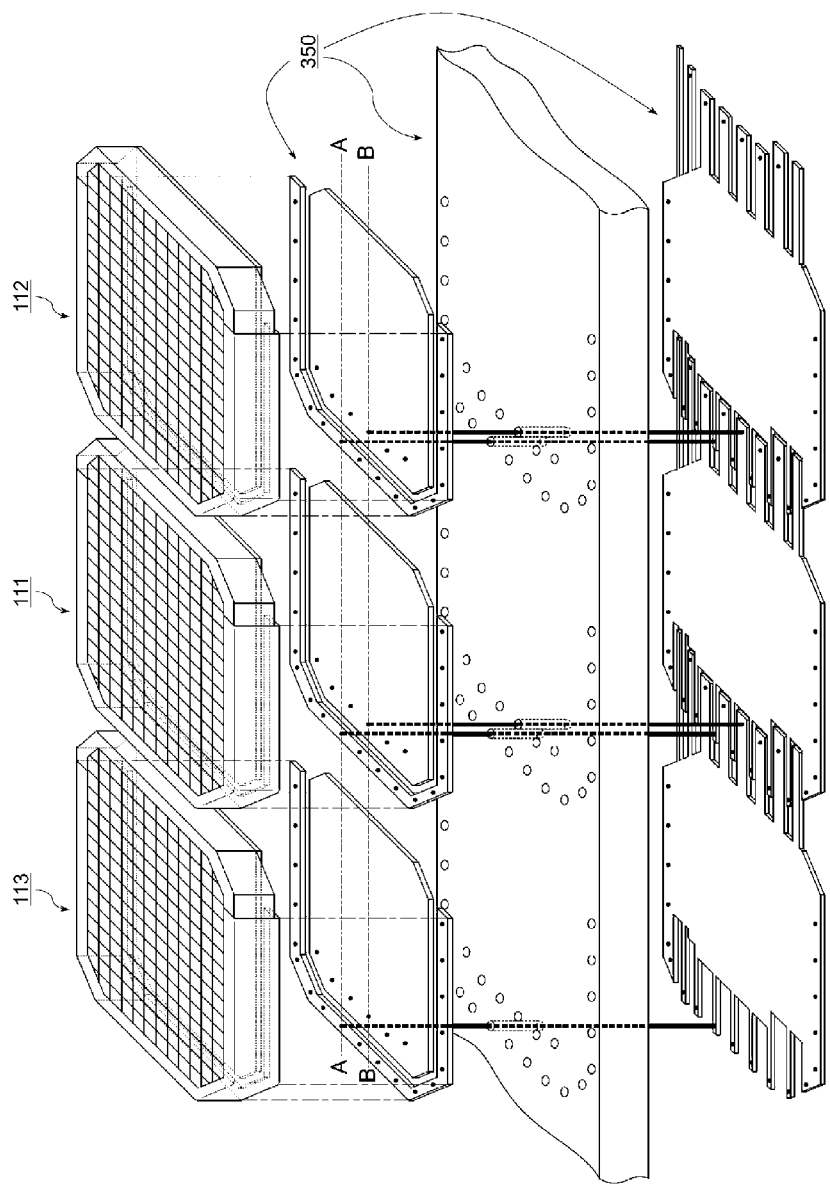
FIG. 14 is an exploded perspective view showing another embodiment of electrical connection of a solar cell and a wiring sheet.
Figure 15:
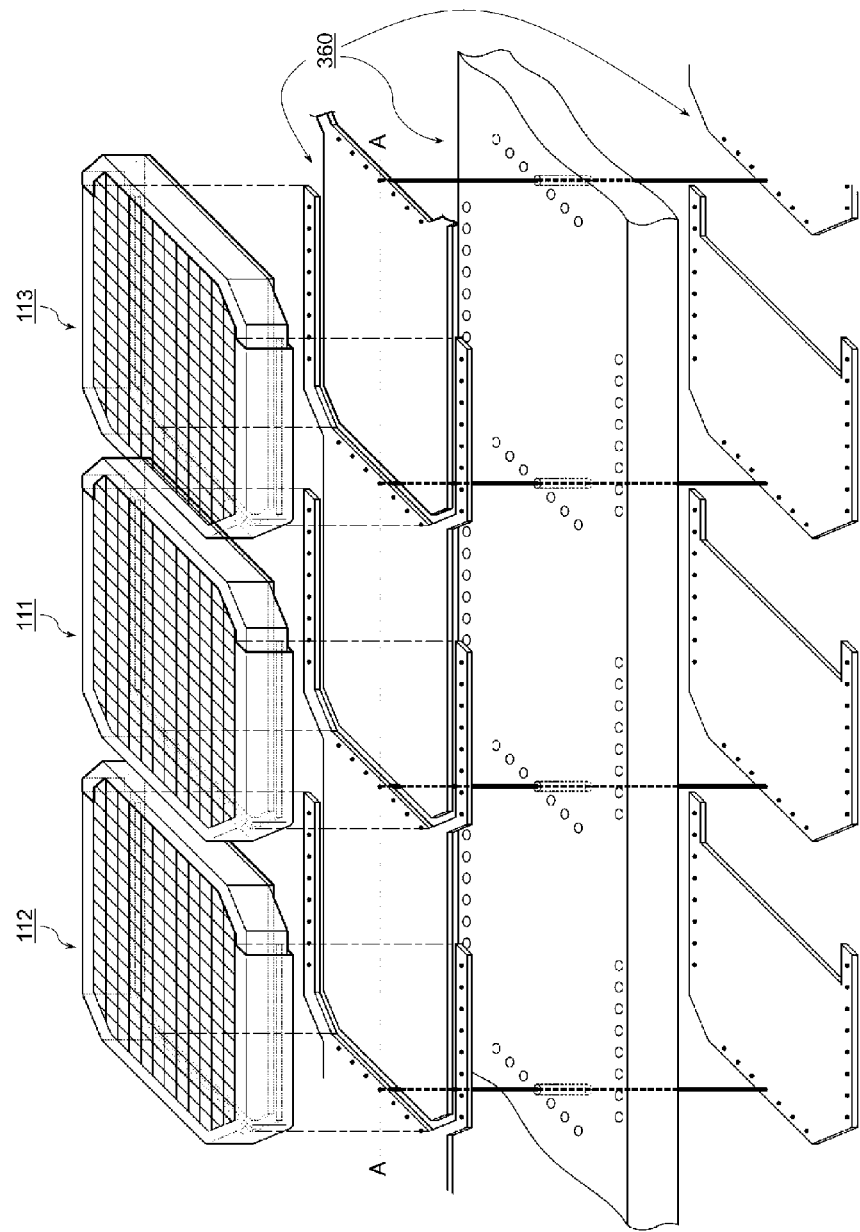
FIG. 15 is an exploded perspective view showing another embodiment of electrical connection of a solar cell and a wiring sheet.

In FIG. 13, a structure in which a connection electrode is provided on the four sides of each of the solar cells 101, 102 and 103 is illustrated as a structure of the solar cell module. As shown in FIGS. 14 and 15, for example, connection electrodes provided on the three sides of each of solar cells 111, 112 and 113 may be connected to wiring sheets 350 and 360. For reducing resistance, a structure in which the four sides of the solar cell are involved in connection to the wiring sheet, as shown in FIG. 13, is preferable. In the case where a collecting electrode is formed by a plating method, the thickness of the plating layer can be made uniform more easily when the four sides of the solar cell are each provided with a connection electrode. On the other hand, when the solar cell has a substantially rectangular plane shape, for example, a collecting electrode extending in a direction along the short side can be shortened, and therefore even when the three sides of the solar cell are involved in connection to the wiring sheet, the solar cell module fully performs its function, and the thickness of the plating layer can be made uniform. The term "substantially rectangular shape" encompasses not only a perfectly rectangular shape but also a shape in which at least one of the vertexes of a rectangle is absent, or the like.

Although It is preferable that the connection electrode is provided on the entire peripheral edge of the first principal surface and the entire peripheral edge of the second principal surface of the solar cell, the connection electrode may be provided on a part of the peripheral edge of each of the principal surfaces. The connection electrode is not necessarily provided on the peripheral edge of the first principal surface of the solar cell as long as the connection electrode is connected to the collecting electrode. Although it is preferable that the connection electrode is provided continuously on the lateral surface of the solar cell, the connection electrode may be provided discontinuously on the lateral surface of the solar cell.

The shape of the collecting electrode of the solar cell is not particularly limited as long as the collecting electrode is formed in a pattern shape. In the present invention, a current can be collected by the connection electrode, and therefore it is preferable that a bus bar electrode does not exist on the first principal surface. Preferably, the collecting electrode includes a plurality of finger electrodes as shown in FIG. 2A. When the collecting electrode includes a plurality of finger electrodes, a plurality of finger electrodes may extend only in one direction. It is preferable that a plurality of finger electrodes crosses one another. When a plurality of finger electrodes crosses one another, and have an intersection, deterioration of module characteristics can be suppressed even if the finger electrodes are partially disconnected. In particular, it is preferable that a plurality of finger electrodes is provided in a grid shape as shown in FIG. 2A.

In modularization of the solar cell of the present invention using the wiring sheet, the configuration of the wiring sheet (e.g., shapes of insulating base, front-surface wiring line and back-surface wiring line) is not limited to the configuration described above, and any configuration may be employed.

Preferably, the front-surface wiring line 311 is continuously formed so as to surround the front-surface wiring line 313 as shown in FIG. 13. Although it is preferable that the front-surface wiring line that is in contact with the connection electrode of the solar cell is continuously provided so as to couple electrical continuity sections provided in a plurality of through-holes, the front-surface wiring line may have a discontinuous shape such as a perforation shape. The front-surface wiring line may be provided only on the electrical continuity section because the front-surface wiring line may be in electrical continuity with the back-surface wiring line through the electrical continuity section of the insulating base.

Preferably, the front-surface wiring line 313 is formed in a planar shape as shown in FIG. 13. It is preferable that the shape of the front-surface wiring line that is in contact with the back electrode of the solar cell conforms to the shape of the back electrode. The shape of the front-surface wiring line may be different from the shape of the back electrode. For example, the front-surface wiring line may be formed in a planar shape while the back electrode of the solar cell is formed in a pattern shape, or the front-surface wiring line may be formed in a pattern shape while the back electrode of the solar cell is formed in a planar shape Like the front-surface wiring line that is in contact with the connection electrode of the solar cell, the front-surface wiring line that is in contact with the back electrode may be provided only on the electrical continuity section. The wiring sheet does not necessarily include a front-surface wiring line, as long as the connection electrode or back electrode of the solar cell is in electrical continuity with the back-surface wiring line through the electrical continuity section of the insulating base.

In modularization of the solar cell of the present invention, it is preferable that the solar cell is connected to other solar cell etc. through the wiring sheet as shown in FIGS. 11 to 15. The solar cell may be connected to other solar cell etc. through an interconnector such as a tab line in place of the wiring sheet.

In modularization of the solar cell, it is preferable that a plurality of solar cells of the present invention is connected. A solar cell having a configuration different from that of the solar cell of the present invention may exist. When the solar cell module includes three or more solar cells, all the solar cells may be connected in series, or some of the solar cells may be connected in parallel. For example, when the solar cell module includes three solar cells, the three solar cells may be connected in series as shown in FIG. 13, or series connection and parallel connection may be combined. Solar cells to be connected in parallel may be connected through only the front-surface wiring line of the wiring sheet.

DESCRIPTION OF REFERENCE CHARACTERS

| | |
|---|---|
| 1 | conductive single-crystalline silicon substrate |
| 2a, 2b | intrinsic silicon-based thin-film |
| 3a, 3b | conductive silicon-based thin-film |
| 6a, 6b, 6c | transparent electrode layer |
| 7, 7a, 7b, 7c | collecting electrode |
| 8, 8a, 8b, 8c | back electrode |
| 9, 9a, 9b, 9c | connection electrode |
| 50 | photoelectric conversion section |
| 71, 81, 91 | metal seed layer |
| 72, 82, 92 | plating layer |
| 100, 101, 102, 103, 111, 112, 113 | solar cell |
| 200 | solar cell module |
| 201 | light-receiving-side protecting member |
| 202 | back-side protecting member |
| 203 | encapsulant |
| 300, 350, 360 | wiring sheet |
| 311, 312, 313, 314, 315, 316 | front-surface wiring line |
| 321, 322, 323 | back-surface wiring line |
| 330 | insulating base |
| 401, 402, 403, 404, 405 | electrical continuity section |
| 411., 412, 413, 414, 415 | through-hole |

The invention claimed is:

1. A solar cell, comprising:
a photoelectric conversion section, comprising:
   a conductive single-crystalline silicon substrate;
   a first conductivity-type silicon-based thin-film on a first surface of the conductive single-crystalline silicon substrate;
   a first transparent electrode layer on the first conductivity-type silicon-based thin-film;
   a second conductivity-type silicon-based thin-film different from the first conductivity-type silicon-based thin-film, the second conductivity-type silicon-based thin-film being on a second surface of the conductive single-crystalline silicon substrate that is opposite to the first surface of the conductive single-crystalline silicon substrate; and
   a second transparent electrode layer on the second conductivity-type silicon-based thin-film;
a collecting electrode on the first transparent electrode layer;
a back electrode on the second transparent electrode layer; and
a connection electrode electrically connected with the collecting electrode, the connection electrode being electrically isolated from the back electrode,
wherein
   the collecting electrode comprises a first metal seed layer on the first transparent electrode layer, and a first-plating layer on the first metal seed layer,
   the back electrode comprises a second metal seed layer on the second conductivity-type silicon-based thin-film,
   the connection electrode comprises a third metal seed layer on a peripheral edge of the second conductivity-type silicon-based thin-film as well as on an end-edge of the second conductivity-type silicon-based thin-film, and a third plating layer on the third metal seed layer,
   the third metal seed layer is electrically connected with the first metal seed layer, and is not electrically connected with the second metal seed layer,
   the second metal seed layer and the third metal seed layer comprise a same material, and
   the first plating layer and the third plating layer comprise a same material.

2. The solar cell according to claim 1, wherein the back electrode further includes a second plating layer on the second metal seed layer.

3. The solar cell according to claim 1, wherein the photoelectric conversion section further comprises:
- a third transparent electrode layer on the peripheral edge of the second conductivity-type silicon-based thin-film, on the end-edge of the second conductivity-type silicon-based thin-film, and in contact with the first conductivity-type silicon-based thin film, the third transparent electrode layer being electrically isolated from the second transparent electrode layer, and the third transparent electrode layer is between the third metal seed layer and the second-type silicon-based thin film.

4. A solar cell module comprising:
- a plurality of solar cells, each solar cell of the plurality of solar cells being a solar cell as set forth in claim 1; and
- a wiring sheet having a first surface and a second surface opposite to the first surface, electrically connecting the plurality of solar cells in series,
- the plurality of solar cells further comprising:
  - a first solar cell and a second solar cell, the first solar cell and the second solar cell are each disposed in such a manner that the back electrode of the first solar cell and the second solar cell faces the first surface of the wiring sheet,
- the wiring sheet further comprising:
  - an insulating base having a first side and a second side opposite to the first side, a first through-hole extending from the first side to the second side, and a second through-hole separated from the first through-hole extending from the first side to the second side;
  - a first electrical continuity section in the first through-hole;
  - a second electrical continuity section in the second through-hole; and
  - a first back-surface wiring line on the second side of the insulating base electrically connecting the first electrical continuity section and the second electrical continuity section to each other, and
- the first electrical continuity section is electrically connected to the connection electrode of the first solar cell, and the second electrical continuity section is electrically connected to the back electrode of the second solar cell, so that the collecting electrode of the first solar cell and the back electrode of the second solar cell are electrically connected to each other through the connection electrode of the first solar cell, the first electrical continuity section, the first back-surface wiring line and the second electrical continuity section.

5. The solar cell module according to claim 4, wherein the wiring sheet further comprises:
- a first front-surface wiring line; and
- a second front-surface wiring on the first side of the insulating base,
- the first front-surface wiring line is electrically connected to the first back-surface wiring line through the first electrical continuity section,
- the second front-surface wiring line is electrically connected to the first back-surface wiring line through the second electrical continuity section, and
- the connection electrode of the first solar cell is connected to the first front-surface wiring line, and the back electrode of the second solar cell is connected to the second front-surface wiring line, so that the collecting electrode of the first solar cell and the back electrode of the second solar cell are electrically connected to each other.

6. The solar cell module according to claim 4, further comprising a third solar cell electrically connected to the first solar cell in series,
wherein
- the third solar cell is disposed in such a manner that a back electrode of the third solar cell faces the first surface of the wiring sheet,
- the insulating base further comprises:
  - a third through-hole and a fourth though-hole,
- the wiring sheet further comprises:
  - a second back-surface wiring line on the second surface of the insulating base;
  - a third electrical continuity section in the third through-hole; and
  - a fourth electrical continuity section in the fourth through-hole,
- the second back-surface wiring line electrically connects the third electrical continuity section and the fourth electrical continuity section to each other, and
- the third electrical continuity section is electrically connected to a back electrode of the first solar cell, and the fourth electrical continuity section is electrically connected to a connection electrode of the third solar cell, so that the back electrode of the first solar cell and a collecting electrode of the third solar cell are electrically connected to each other through the third electrical continuity section, the second back-surface wiring line, the fourth electrical continuity section, and the connection electrode of the third solar cell.

7. The solar cell module according to claim 6, the wiring sheet further comprising:
- a first front-surface wiring line electrically connected to the first back-surface wiring line through the first electrical continuity section;
- a second front-surface wiring line electrically connected to the first back-surface wiring line through the second electrical continuity section;
- a third front-surface wiring line electrically connected to the second back-surface wiring line through the third electrical continuity section; and
- a fourth front-surface wiring line on the first surface of the insulating base, electrically connected to the second back-surface wiring line through the fourth electrical continuity section,
wherein
- the connection electrode of the first solar cell is connected to the first front-surface wiring line, and the back electrode of the second solar cell is connected to the second front-surface wiring line, so that the collecting electrode of the first solar cell and the back electrode of the second solar cell are electrically connected to each other, and
- the back electrode of the first solar cell is connected to the third front-surface wiring line, and the connection electrode of the third solar cell is connected to the fourth front-surface wiring line, so that the back electrode of the first solar cell and the collecting electrode of the third solar cell are electrically connected to each other.

8. The solar cell module according to claim 7, wherein the first front-surface wiring line is on the periphery of the third front-surface wiring line such that the first front-surface wiring line and the third front-surface wiring are electrically isolated.

9. The solar cell module according to claim 4, wherein the first electrical continuity section comprises a first conductive material filled in the first through-hole, and the second electrical continuity section comprises a second conductive material filled in the second through-hole.

10. The solar cell module according to claim 7, wherein the first back-surface wiring line and the second back-surface wiring line are electrically isolated from one another.

11. The solar cell module according to claim 8, wherein the first front-surface wiring line is in contact with the connecting electrode on the peripheral edge of the second conductivity-type silicon-based thin-film.

12. The solar cell according to claim 1, wherein the connection electrode extends over a peripheral edge of the first conductivity-type silicon-based thin-film.

13. The solar cell according to claim 12, wherein a length of the connection electrode extending from an end-edge of the first conductivity-type silicon-based thin-film over the peripheral edge of the first conductivity-type silicon-based thin-film is different from a length of the connection electrode extending from the end-edge of the second conductivity-type silicon-based thin-film over the peripheral edge of the second conductivity-type silicon-based thin-film.

14. The solar cell according to claim 12, wherein the first conductivity-type silicon based thin-film is free from having the first transparent electrode layer on the peripheral edge thereof.

15. The solar cell according to claim 1, further comprising:

a first intrinsic silicon-based thin-film between the single-crystalline silicon substrate and the first conductive-type silicon-based thin-film; and a second intrinsic silicon-based thin-film between the single-crystalline silicon substrate and the second conductive-type silicon-based thin-film.

16. The solar cell according to claim 1, wherein a surface of an outermost layer of the back electrode with respect to the second surface of the conductive single-crystalline silicon substrate is planar.

17. The solar cell according to claim 1, wherein the conductive single-crystalline silicon substrate comprises n-type single-crystalline silicon.

18. The solar cell according to claim 1, wherein the first surface and the second surface of the conductive single-crystalline silicon substrate have a texture.

19. The solar cell according to claim 1, wherein the collecting electrode comprises a plurality of first conductive lines extending from an end-edge of the connection electrode in a first direction on the first surface of the conductive single-crystalline silicon substrate.

20. The solar cell according to claim 19, wherein the plurality of collecting electrode further comprises a plurality of second conductive lines extending in a second direction perpendicular to the first direction such that the first conductive lines of the plurality of first conductive lines and the second conductive lines of the plurality of second conductive lines are arranged in a grid pattern.

* * * * *